United States Patent
Sakamoto (10) Patent No.: US 6,991,954 B2
(45) Date of Patent: Jan. 31, 2006

(54) METHOD OF MANUFACTURING ORGANIC ELECTROLUMINESCENCE DISPLAY DEVICE

(75) Inventor: Gosuke Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/002,471

(22) Filed: Dec. 3, 2004

(65) Prior Publication Data

US 2005/0136783 A1  Jun. 23, 2005

Related U.S. Application Data

(62) Division of application No. 10/643,943, filed on Aug. 20, 2003, now Pat. No. 6,844,211.

(30) Foreign Application Priority Data

Aug. 20, 2002  (JP) ............................ P2002-239173

(51) Int. Cl.
*H01L 21/00*  (2006.01)

(52) U.S. Cl. ........................ 438/29; 438/34; 438/99; 438/669

(58) Field of Classification Search ................ 438/29, 438/99, 34, 669, 670, 948, 951
See application file for complete search history.

(56) References Cited

U.S. PATENT DOCUMENTS 6,652,700 B1 * 11/2003 Namikawa et al. ......... 156/247

* cited by examiner

*Primary Examiner*—George Fourson
*Assistant Examiner*—Julio Maldonado
(74) *Attorney, Agent, or Firm*—Buchanan Ingersoll PC (57) ABSTRACT

A metal layer A constituting the stripe-shaped cathode electrode is formed on the surface of the organic electroluminescence layer 13, a peeling film B is stuck to the surface of the metal layer A through such an adhesive C as to reduce adhesion to the metal layer by the irradiation of ultraviolet light, and a pattern according to the stripe-shaped cathode electrodes 14 is baked onto the peeling film B by the irradiation of ultraviolet light E by using a mask D and the peeling film B is then peeled from the organic electroluminescence layer 13.

8 Claims, 8 Drawing Sheets

METHOD OF MANUFACTURING ORGANIC ELECTROLUMINESCENCE DISPLAY DEVICE

This application is a divisional of application Ser. No. 10/643,943 filed Aug. 20, 2003 now U.S. Pat. No. 6,844,211.

BACKGROUND OF THE INVENTION

1. Field of the Invention

The present invention relates to a method of manufacturing an organic electroluminescence display device (organic EL display device) comprising an electroluminescence layer (organic EL layer) for emitting a light by the application of a current.

2. Description of the Related Art

Figure 1:
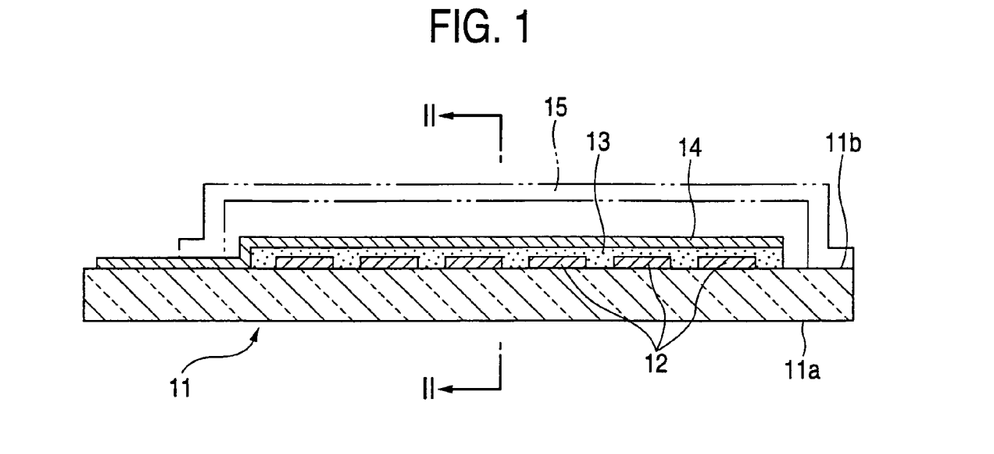
FIG. 1 is a longitudinal sectional front view showing an organic electroluminescence display device.
Figure 2:
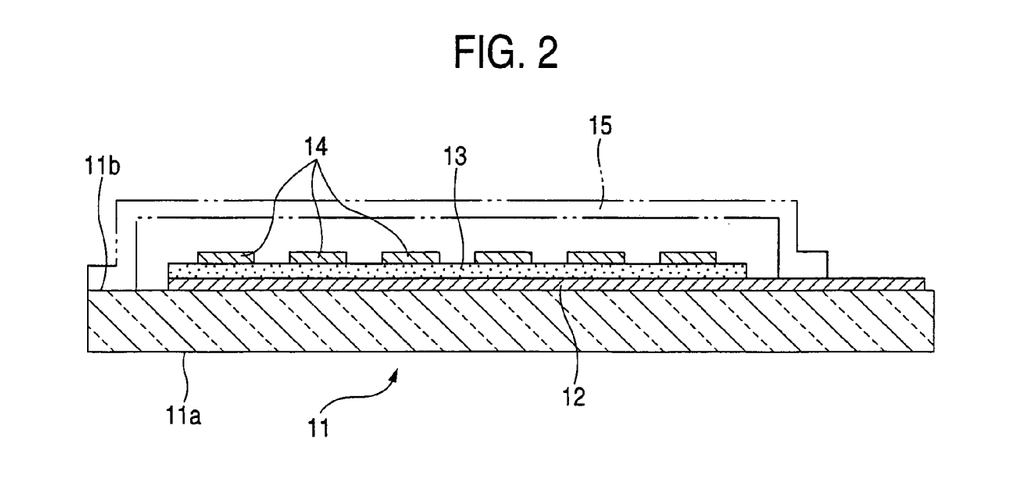
FIG. 2 is a sectional view taken along a line II—II in FIG. 1.
Figure 3:
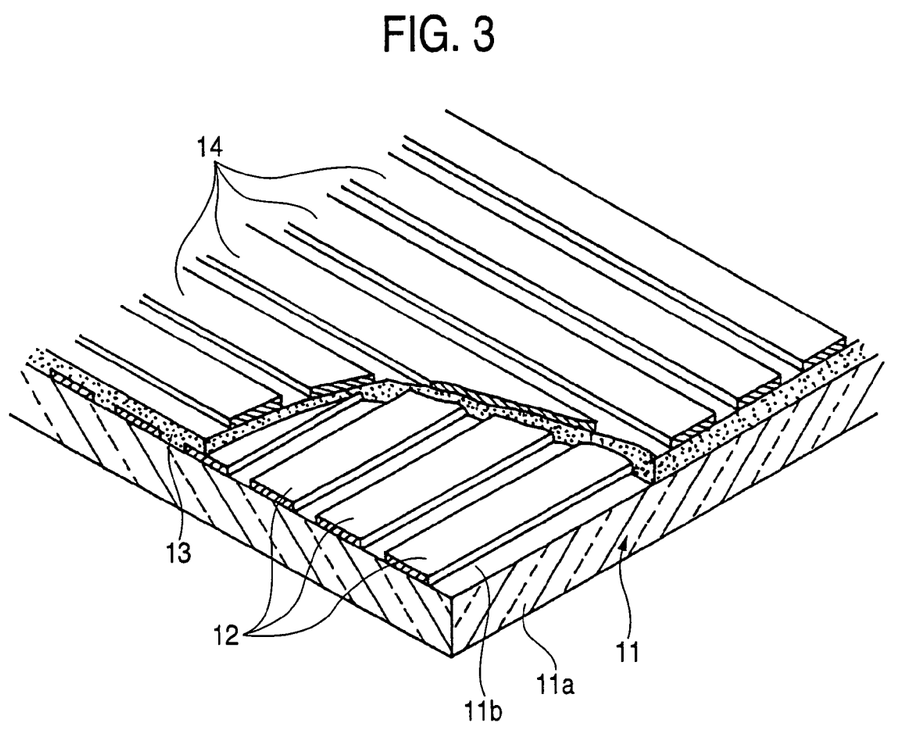
FIG. 3 is a perspective view showing the inner part of the organic electroluminescence display device.

In the organic electroluminescence display device of this type, generally, a large number of stripe-shaped anode electrodes 12 formed by a transparent conductive film are arranged in parallel at a proper interval on a back face 11b opposite to a surface 11a in a transparent substrate 11 such as a glass, an electroluminescence layer 13 is overlaid on each of the stripe-shaped anode electrodes 12, a large number of stripe-shaped cathode electrodes 14 formed by a metal layer are arranged on the electroluminescence layer 13 in parallel at a proper interval in such a direction as to cross the stripe-shaped anode electrode 12, and a current is applied between any of the stripe-shaped anode electrodes 12 and any of the stripe-shaped cathode electrodes 14 to emit a light to the electroluminescence layer 13 in a portion provided therebetween so that a character is displayed on the surface 11a side in the transparent substrate 11 as shown in FIGS. 1 to 3.

A cover 15 for wholly covering the stripe-shaped anode electrode 12, the electroluminescence layer 13 and the stripe-shaped cathode electrode 14 is attached to the back face 11b in the transparent substrate 11.

When an organic electroluminescence display device having this structure is to be manufactured, conventionally, there is employed a first method in which "the large number of stripe-shaped anode electrodes 12 are first formed on the back face 11b of the transparent substrate 11, the organic electroluminescence layer 13 is then overlaid thereon, and a metal mask comprising a through hole according to the pattern of the large number of stripe-shaped cathode electrodes 14 formed by the metal layer is overlaid on the surface of the organic electroluminescence layer 13, and the stripe-shaped cathode electrodes 14 are formed by the metal layer through vacuum evaporation of metal from thereabove, or a second method in which "the large number of stripe-shaped anode electrodes 12 are formed on the back face 11b of the transparent substrate 11, a cathode partition layer is then overlaid thereon by a photoresist and is subjected to patterning according to the stripe-shaped cathode electrodes 14 by photolithography using pattern exposure and baking and a development processing, and the organic electroluminescence layer 13 is formed between the cathode partition layers and the stripe-shaped cathode electrode 14 is thereafter formed on the surface of the cathode partition layer."

In these manufacturing methods, however, there is a problem in that the steps of forming the stripe-shaped cathode electrode 14 is remarkably increased and complicated, resulting in a considerable increase in a manufacturing cost.

In addition, as in the former case, the method of forming the stripe-shaped cathode electrode 14 by vacuum evaporation using a metal mask has a problem in that the dimension and shape of each of the stripe-shaped cathode electrodes 14 depends on that of the through hole in the metal mask, resulting in a reduction in precision in the dimension and shape and the difficulty of an increase in fineness. In the method of forming the stripe-shaped cathode electrode 14 as in the latter case, moreover, there is a problem in that an increase in fineness is limited and the alignment of a pattern is hard to perform.

SUMMARY OF THE INVENTION

The invention has a technical object to provide a manufacturing method which solves these problems.

In order to attain the technical object, a first aspect of the invention is directed to a method of manufacturing an organic electroluminescence display device comprising the steps of:

forming a large number of stripe-shaped anode electrodes by a transparent conductive film on a surface of a transparent substrate;

forming an organic electroluminescence layer on the surface of the transparent substrate in superposition on the anode electrodes;

forming a metal layer to be a stripe-shaped cathode electrode on a surface of the organic electroluminescence layer;

sticking a light transmitting peeling film to the metal layer through an adhesive which is previously coated on one side of the peeling film and has adhesion to the metal layer reduced by irradiation of ultraviolet light;

baking, onto the peeling film, a pattern according to the stripe-shaped cathode electrodes extended in such a direction as to cross the stripe-shaped anode electrodes through the irradiation of the ultraviolet light by using a mask overlaid thereon; and peeling the peeling film from the organic electroluminescence layer.

Moreover, a second aspect of the invention is directed to the method of manufacturing an organic electroluminescence display device according to the first aspect of the invention, wherein the peeling film is peeled in such a direction that the stripe-shaped cathode electrode is extended.

As described above, the metal layer for the stripe-shaped cathode electrode is formed on the surface of the organic electroluminescence layer, the peeling film is stuck to the surface of the metal layer with the precoated adhesive, and the pattern according to the stripe-shaped cathode electrodes is baked by the irradiation of ultraviolet light onto the peeling film by using the mask. In the portion of the adhesive on which the ultraviolet light are irradiated, consequently, adhesion to the metal layer is reduced.

The peeling film is peeled from the organic electroluminescence layer. Consequently, the portion of the metal layer in which the ultraviolet light are irradiated on the adhesive remains on the organic electroluminescence layer side, and other portions are peeled and removed from the organic electroluminescence layer together with the peeling film. Thus, the metal layer in the portion remaining on the organic electroluminescence layer side constitutes a large number of stripe-shaped cathode electrodes.

In other words, according to the invention, a large number of stripe-shaped cathode electrodes can be formed at the step of sticking the peeling film to the organic electroluminescence layer, baking the pattern of the stripe-shaped cathode electrode onto the peeling film through ultraviolet light and peeling the peeling film. Consequently, the damage of the organic electroluminescence layer can be reduced and fineness can be increased. In addition, it is possible to have such an advantage that the steps can be carried out much more easily than that in the related art and a manufacturing cost can be reduced considerably.

As described in the second aspect of the invention, particularly, the peeling film is peeled in such a direction that the stripe-shaped cathode electrode is extended. When the peeling film is to be peeled, consequently, the generation of a cut in the middle over the portion of the conductive adhesive which remains on the organic electroluminescence layer side can be lessened. Thus, it is possible to produce such an advantage that the rate of generation of defective products can be reduced reliably.

DESCRIPTION OF THE PREFERRED EMBODIMENTS

An embodiment of the invention will be described below with reference to FIGS. 4 to 14.

Figure 4:
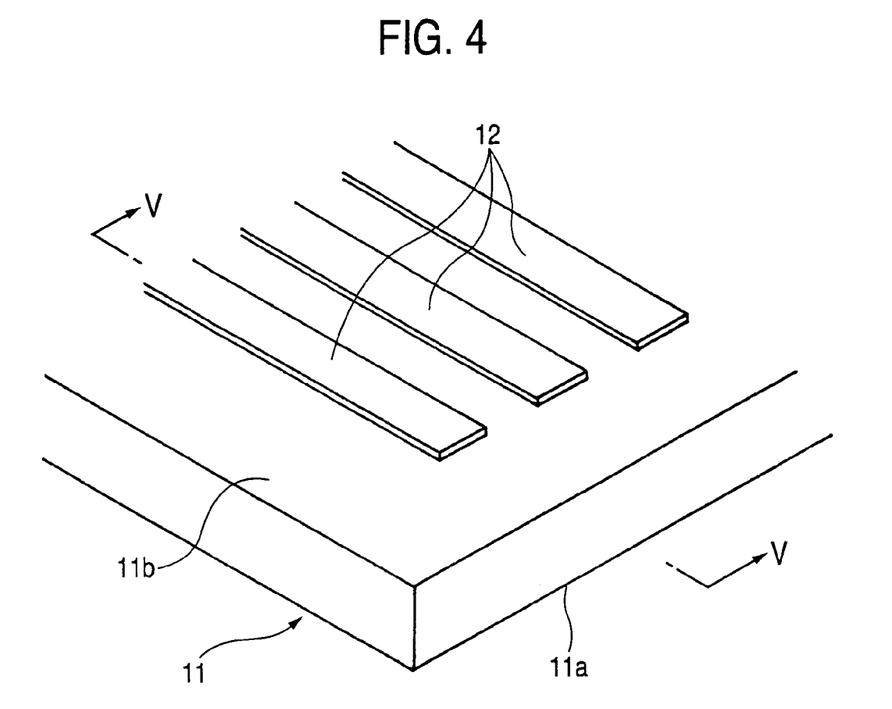
FIG. 4 is a perspective view showing a state in which a stripe-shaped anode electrode is formed on a transparent substrate according to the invention.
Figure 5:
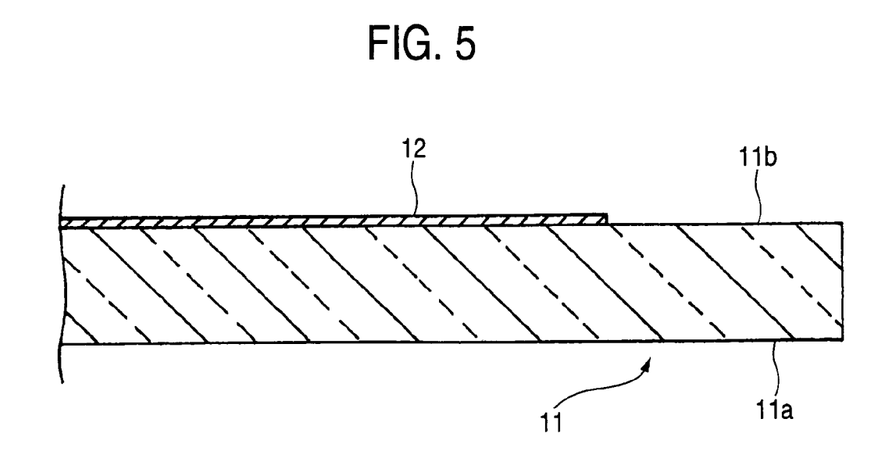
FIG. 5 is a sectional view taken along a line V—V in FIG. 4.

First of all, a large number of stripe-shaped anode electrodes 12 formed by a transparent conductive film are arranged in parallel at a proper interval on a back face 11b opposite to a surface 11a in a transparent substrate 11 such as a glass constituting the organic electroluminescence display device shown in FIGS. 1 to 3 by a conventional well-known method as shown in FIGS. 4 and 5.

Figure 6:
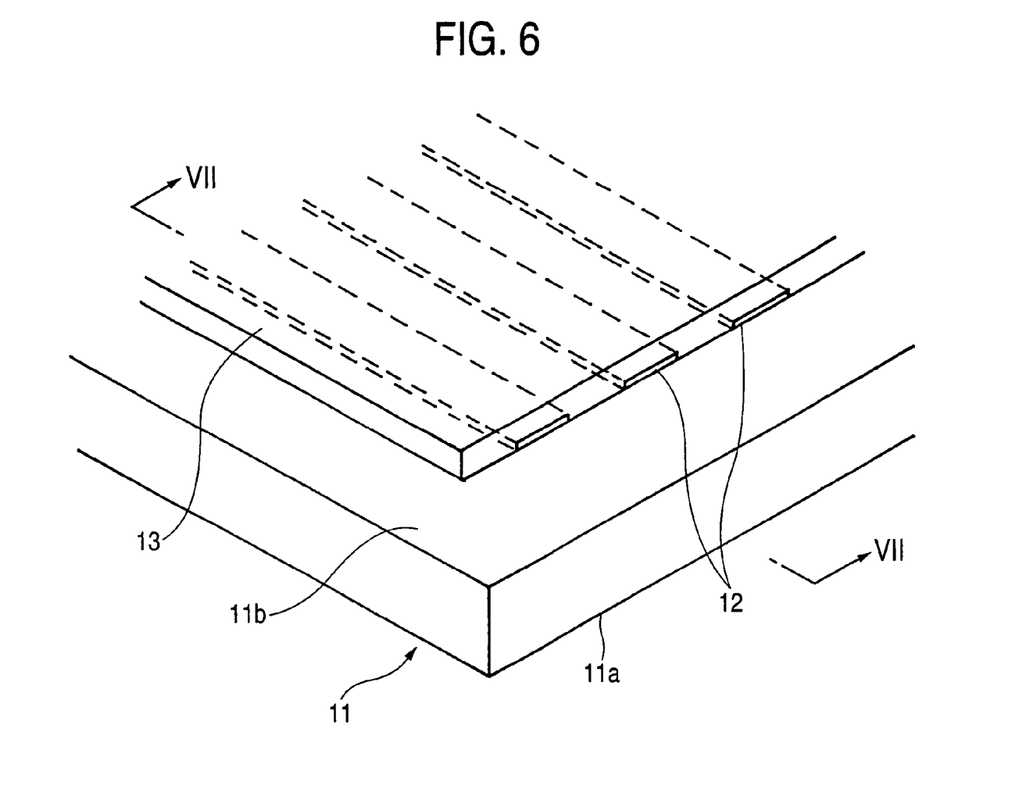
FIG. 6 is a perspective view showing a state in which an organic electroluminescence layer is formed on a transparent substrate in superposition on the stripe-shaped anode electrode according to the invention.
Figure 7:
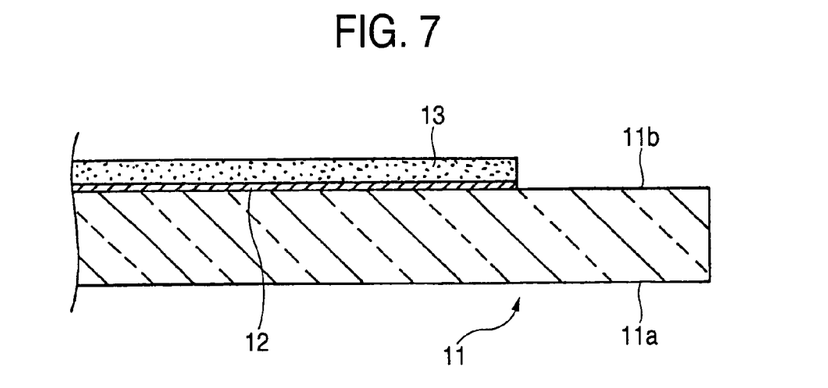
FIG. 7 is a sectional view taken along a line VII—VII in FIG. 6.

Subsequently, an electroluminescence layer 13 is formed on the back face 11b in the transparent substrate 11 such as a glass by a conventional well-known method as shown in FIGS. 6 and 7.

Figure 8:
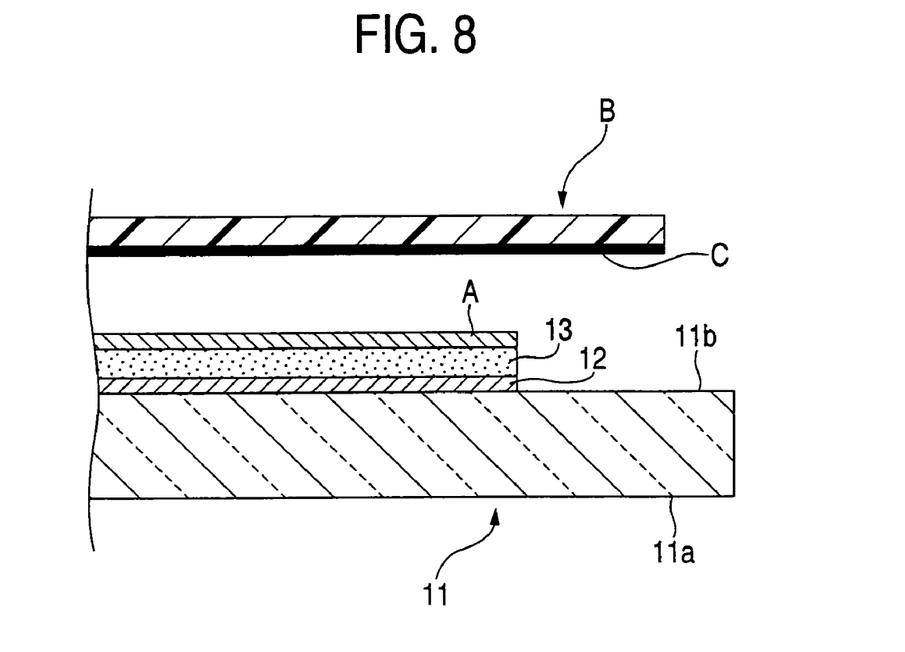
FIG. 8 is a sectional view showing a state in which a metal layer is formed on the organic electroluminescence layer according to the invention.

Next, a metal layer A is formed on the surface of the electroluminescence layer 13 by metal vacuum evaporation or sputtering as shown in FIG. 8.

Figure 9:
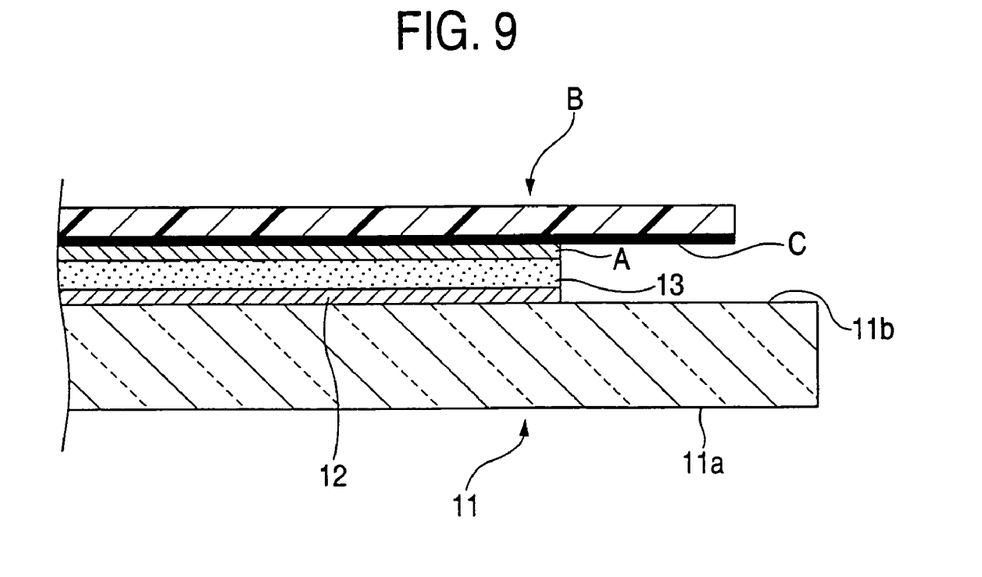
FIG. 9 is a sectional view showing a state in which a peeling film is stuck to the metal layer according to the invention.

Then, a peeling film B formed by a light transmitting soft synthetic resin is stuck to the surface of the metal layer A through adhesion using an adhesive C precoated on a back face thereof as shown in FIG. 9.

In this case, a material which is cured by the irradiation of ultraviolet light to reduce adhesion to the metal layer A is used for the adhesive C.

Figure 10:
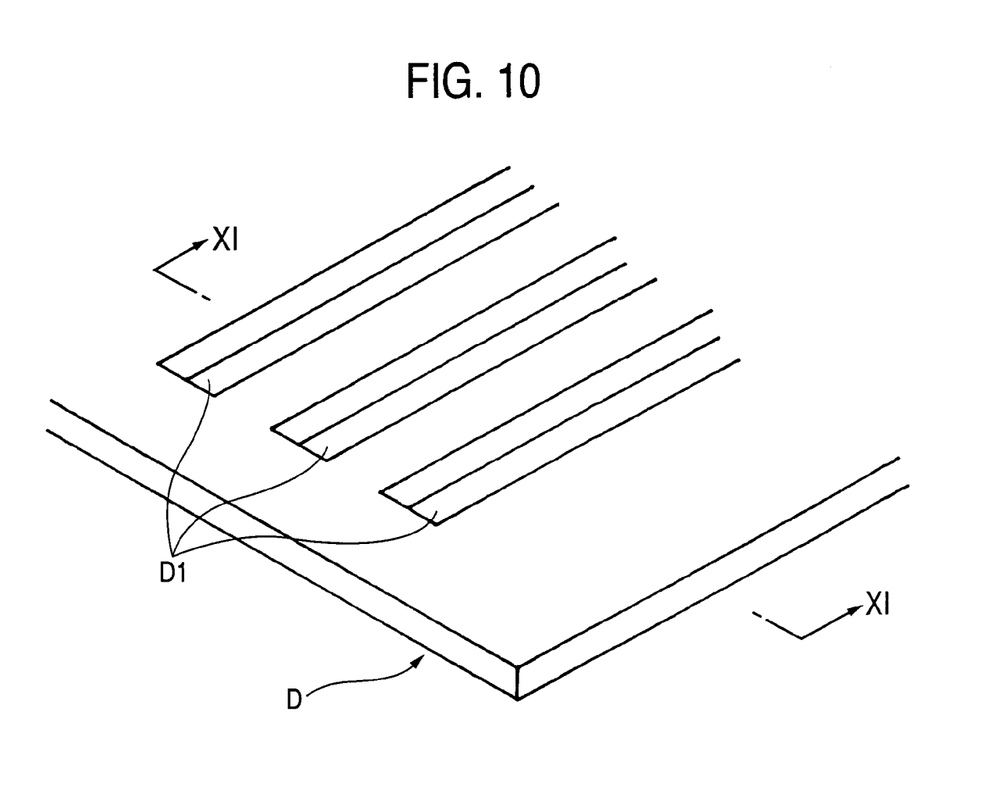
FIG. 10 is a perspective view showing a mask to be used in the invention.
Figure 11:
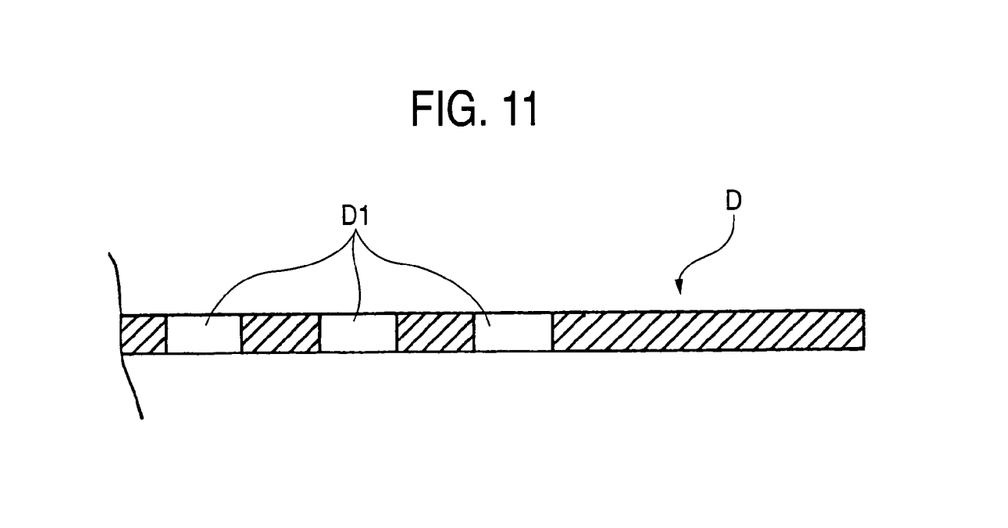
FIG. 11 is a sectional view taken along a line XI—XI in FIG. 10.

On the other hand, as shown in FIGS. 10 and 11, there is prepared a mask D in which a slit hole D1 having a shape in conformity with the shape of each stripe-shaped cathode electrode 14 in the organic electroluminescence display device is provided in the same pattern.

Figure 12:
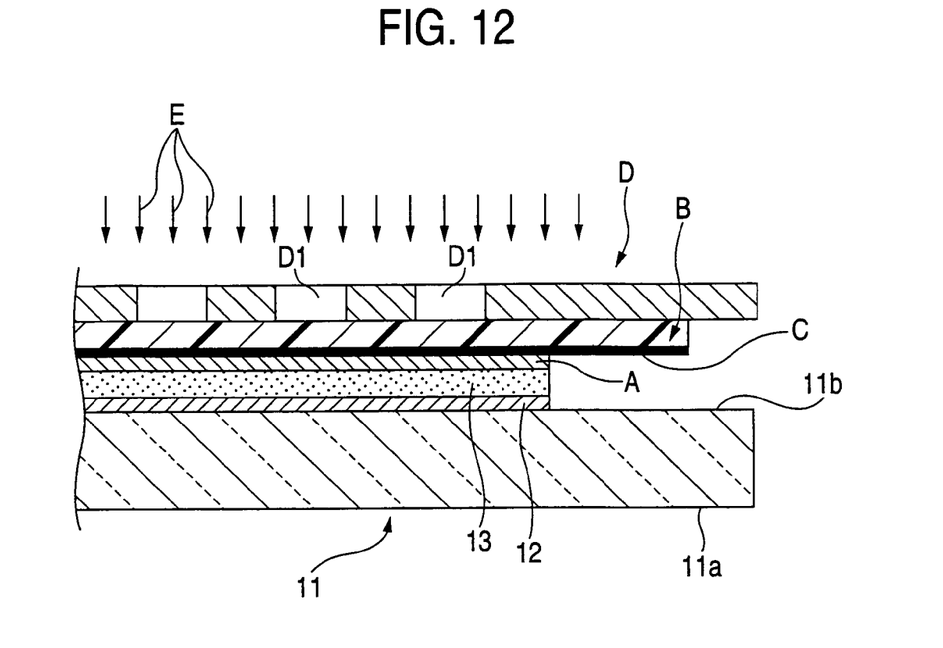
FIG. 12 is a sectional view showing a state in which the peeling film is baked by using the mask according to the invention.

As shown in FIG. 12, the mask D is overlaid on the surface of the peeling film B and ultraviolet light E are irradiated from thereabove. Consequently, a pattern according to the stripe-shaped cathode electrodes 14 is baked onto the peeling film B.

By the irradiation of the ultraviolet light, the adhesion to the metal layer A is reduced in a portion of the adhesive C on which the ultraviolet light are irradiated in the slit hole D1 portion of the mask D.

Figure 13:
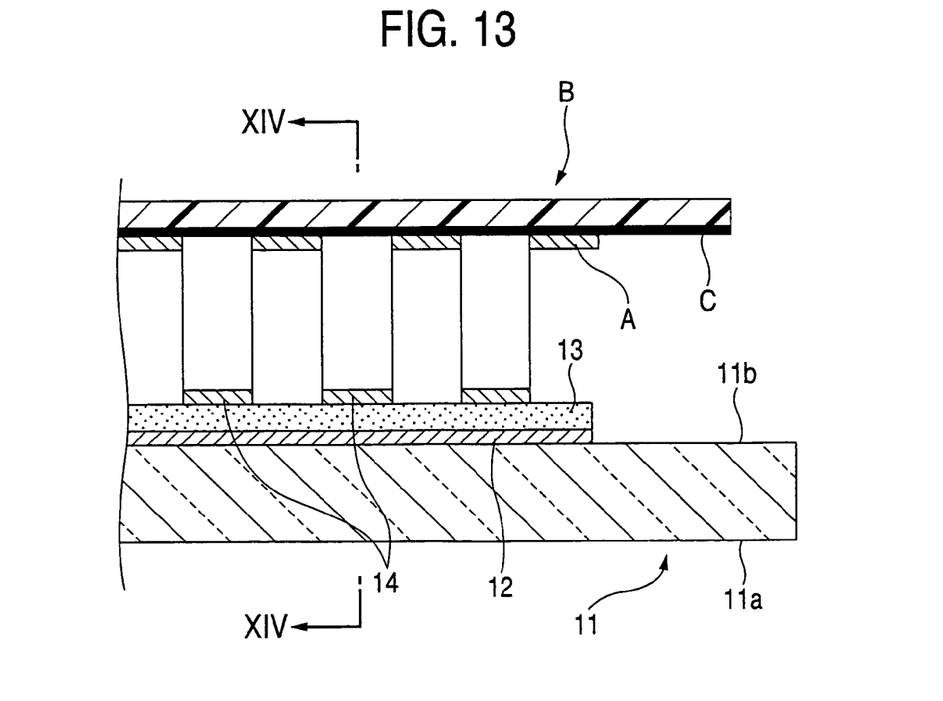
FIG. 13 is a sectional view showing a state in which the peeling film is peeled according to the invention.
Figure 14:
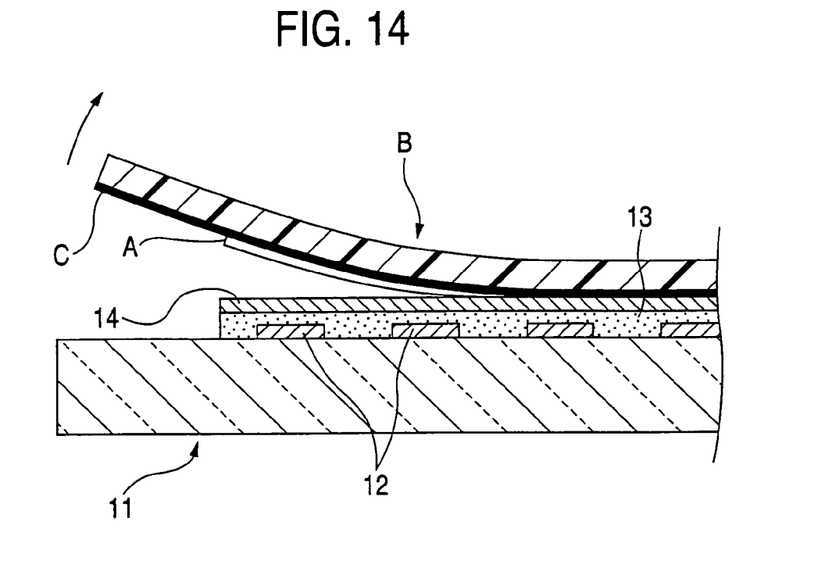
FIG. 14 is a sectional view taken along a line XIV—XIV in FIG. 13.
Figure 15:
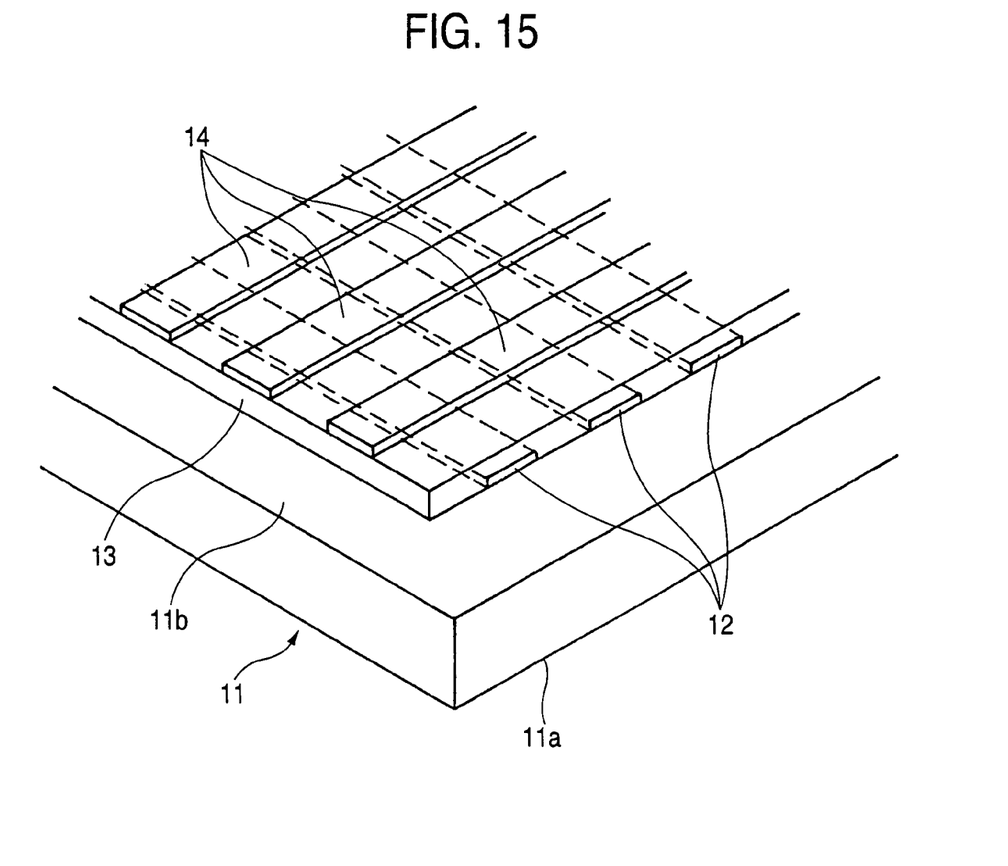
FIG. 15 is a perspective view showing a state obtained after the peeling film is peeled according to the invention.

As shown in FIGS. 13 and 14, the peeling film B is peeled from the organic electroluminescence layer 13. Consequently, only the portion of the metal layer A in which the ultraviolet light are irradiated on the adhesive C remains in a state of bonding to the organic electroluminescence layer 13 side and other portions are peeled and removed from the organic electroluminescence layer 13 together with the peeling film B.

In other words, a large number of stripe-shaped cathode electrodes 14 are formed by the metal layer A in a predetermined pattern over the surface of the organic electroluminescence layer 13.

When the peeling film B is to be peeled, moreover, the peeling is carried out in such a direction that the stripe-shaped cathode electrode 14 is extended as shown in FIG. 14. When the peeling film B is to be peeled, consequently, it is possible to reliably lessen the generation of a cut in the middle in the portion of the metal layer A which remains on the organic electroluminescence layer 13 side, that is, the stripe-shaped cathode electrode 14 portion.

What is claimed is:

1. A method of manufacturing an organic electroluminescence display device, in which a plurality of layers, including at least an organic electroluminescence layer and electrode layers thereof, are provided, said method comprising the steps of:

forming a metal layer on one of plurality of layers, and peeling a sticking layer, which is placed on said metal layer, wherein a part of said metal layer is peeled with the sticking layer while another part of the sticking layer remains on one of said plurality of layers to form an electrode pattern thereon, wherein a first adhesive region and a second adhesive region are provided on said sticking layer, an adhesive force of the first adhesive region being less than that of the second adhesive region, further wherein said another part of the sticking layer is said first adhesive region.

2. The method of manufacturing an organic electroluminescence display device according to claim 1, wherein said sticking layer is formed on a peeling film having a light transmitting property.

3. The method of manufacturing an organic electroluminescence display device according to claim 2, wherein said method is further comprised of the steps of:
   masking a mask with a pattern overlaid to the peeling film, and
   irradiating a light to the sticking layer throughout the peeling film and the mask prior to peeling said sticking layer so that the first adhesive region and the second adhesive region of the sticking layer are formed.

4. The method of manufacturing an organic electroluminescence display device according to claim 3, wherein the first adhesive region and the second adhesive region include a substance of which adhesive force is lowered when the substance is subjected to ultraviolet light.

5. The method of manufacturing an organic electroluminescence display device according to claim 1, wherein said one of said plurality of layers is one of the electrodes.

6. The method of manufacturing an organic electroluminescence display device according to claim 1, wherein said one of said plurality of layers is formed on the electroluminescence layer.

7. The method of manufacturing an organic electroluminescence display device according to claim 1, wherein said pattern is formed in a stripe-shaped.

8. The method of manufacturing an organic electroluminescence display device according to claim 7, wherein a peeling direction of the sticking layer is a longitudinal direction of the stripe-shaped pattern.

* * * * *